(12) United States Patent
Nakamura

(10) Patent No.: US 6,920,590 B2
(45) Date of Patent: Jul. 19, 2005

(54) SEMICONDUCTOR APPARATUS FOR PROVIDING RELIABLE DATA ANALYSIS OF SIGNALS

(75) Inventor: Yoshiyuki Nakamura, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 531 days.

(21) Appl. No.: 09/965,565

(22) Filed: Sep. 27, 2001

(65) Prior Publication Data

US 2002/0040455 A1 Apr. 4, 2002

(30) Foreign Application Priority Data

Sep. 29, 2000 (JP) ........................................ 2000-298096

(51) Int. Cl.⁷ .............................. G06F 11/00; G06F 7/02
(52) U.S. Cl. .................... 714/703; 714/798; 714/819
(58) Field of Search ................................. 714/703, 798, 714/819, 820, 821, 824, 712, 718, 719, 738, 737, 735, 736

(56) References Cited

U.S. PATENT DOCUMENTS

| 4,942,576 A | | 7/1990 | Busack et al. ............... 714/719 |
|---|---|---|---|
| 4,953,128 A | * | 8/1990 | Kawai et al. ................ 365/194 |
| 5,553,082 A | * | 9/1996 | Connor et al. ............... 714/733 |
| 5,633,882 A | * | 5/1997 | Babb et al. .................. 714/785 |
| 5,646,490 A | * | 7/1997 | Carson et al. ............... 315/317 |
| 6,317,512 B1 | * | 11/2001 | Maeda et al. ................ 382/141 |

FOREIGN PATENT DOCUMENTS

| DE | 195 10 990 A1 | 9/1995 |
|---|---|---|
| EP | 0 541 840 A1 | 5/1993 |
| JP | H6-201801 | 7/1994 |
| JP | 07198803 | 1/1995 |
| JP | H7-31610 | 4/1995 |
| JP | H10-187554 | 7/1998 |
| JP | 2000-76894 | 3/2000 |

* cited by examiner

*Primary Examiner*—Christine T. Tu
(74) *Attorney, Agent, or Firm*—Scully, Scott, Murphy & Presser

(57) ABSTRACT

A semiconductor apparatus is composed of a signal providing circuit and a data analyzer. The signal providing circuit provides an input signal set including at least one input signal. The data analyzer outputs a digital result signal in synchronization with a clock signal. The data analyzer inverts the digital result signal at a timing indicated by the clock signal while the input signal set is in a predetermined state, and does not invert the digital result signal while the input signal set is not in the predetermined state.

6 Claims, 9 Drawing Sheets

Fig. 3

| DOUT | DATAE | QOUT | DIN |
|------|-------|------|-----|
| 0 | 0 | 0 | 1 |
| 1 | 0 | 0 | 0 |
| 0 | 1 | 0 | 0 |
| 1 | 1 | 0 | 1 |
| 0 | 0 | 1 | 0 |
| 1 | 0 | 1 | 1 |
| 0 | 1 | 1 | 1 |
| 1 | 1 | 1 | 0 |

SEMICONDUCTOR APPARATUS FOR PROVIDING RELIABLE DATA ANALYSIS OF SIGNALS

BACKGROUND OF THE INVENTION

1. Field of the Invention

The present invention relates to a semiconductor apparatus. More particularly, the present invention relates to a semiconductor apparatus for reliable analysis of signals.

2. Description of the Related Art

A semiconductor apparatus often carries out data analysis or comparison of signals. In particular, a semiconductor apparatus for testing a semiconductor circuit compares a circuit response signal from the semiconductor circuit with an expected response signal expected to be sent from the semiconductor circuit.

A data analyzer is disclosed in Japanese Laid Open Patent Application (JP-A-Heisei, 6-201801). The conventional data analyzer includes exclusive-OR gates 101–104 and an OR gate 105, as shown in FIG. 1. First inputs of the exclusive-OR gates 101–104 are coupled to receive a circuit response signal (CIRCUIT RESPONSE (X)), respectively. CIRCUIT RESPONSE (X) is the signal outputted by the semiconductor circuit to be tested. Second inputs of the exclusive-OR gates 101 to 104 are coupled to receive an expected response signal (EXPECTED RESPONSE (X)), respectively. EXPECTED RESPONSE (X) is the signal expected to be outputted by the semiconductor circuit. Each of the exclusive-OR gates 101 to 104, if CIRCUIT RESPONSE (X) and EXPECTED RESPONSE (X) coincide with each other, outputs "0", and if they do not coincide, outputs "1". Respective outputs of the exclusive-OR gates 101 to 104 are connected to respective inputs of the OR gate 105. An output of the OR gate 105 is connected to a terminal 106. On the basis of a signal appearing in the terminal 106, it is judged whether or not CIRCUIT RESPONSE (X) and EXPECTED RESPONSE (X) coincide with each other.

However, the conventional data analyzer can not distinguish a case when the data analyzer has a failure from a case when the tested semiconductor circuit has a failure. For example, let us suppose that the exclusive-OR gate 101 has a failure and the output of the exclusive-OR gate 101 is fixed to a logic "0". In this case, it can not be judged from the signal outputted by the exclusive-OR gate 101 whether the exclusive-OR gate 101 outputs the logic "0" since signal CIRSUIT RESPONSE (0) and EXPECTED RESPONSE (0) coincide with each other, or the exclusive-OR gate 101 outputs the logic "0" since the exclusive-OR gate 101 has a failure and the output of the exclusive-OR gate 101 is fixed to the logic "0".

Other techniques for testing circuits are disclosed in Japanese Laid Open Patent Application (Jp-A-Heisei 10-187554, Jp-A 2000 76894). However, none of the disclosed techniques deals with the above-mentioned problem.

Still another technique for self-testing of a circuit is disclosed in Japanese Patent Gazette (Jp-B-Heisei 7-31610). However, the disclosed circuit do not achieve a reliable self-test if the testing circuit has a failure and thereby the output of the testing circuit is fixed to a value.

It is desired to eliminate the possibility that compared signals are recognized to be identical because of a failure of a comparing circuit.

SUMMARY OF THE INVENTION

Therefore, an object of the present invention is to provide a comparing circuit in which it is possible to eliminate the possibility that comparison signals are recognized to be identical because of a failure of the comparing circuit.

Another object of the present invention is to provide a comparing circuit, a failure of which is easily detected.

Still another object of the present invention is to provide a comparing circuit for reducing a time required to test the semiconductor apparatus when the comparing circuit is used to test a semiconductor apparatus.

Still another object of the present invention is to provide a comparing circuit that enable to simultaneously prove that a plurality of the signals coincide with each other and that the comparing circuit itself has no failure.

Still another object of the present invention is to provide a data analyzer for judging whether or not a signal is at a predetermined state, a failure of which is easily detected.

Still another object of the present invention is to provide a data analyzer that enables to simultaneously prove that a signal(s) is at some state and that the data analyzer itself has no failure.

In order to achieve an aspect of the present invention, a semiconductor apparatus is composed of a signal providing circuit and a data analyzer. The signal providing circuit provides an input signal set including at least one input signal. The data analyzer outputs a digital result signal in synchronization with a clock signal. The data analyzer inverts the digital result signal at a timing indicated by the clock signal while the input signal set is in a predetermined state, and does not invert the digital result signal while the input signal set is not in the predetermined state.

In the case when the input signal set includes first and second digital signals, the predetermined state may be a coincident state in which the first and second digital signal coincide with each other.

The data analyzer preferably includes a logic circuit outputting a flip-flop input signal in response to the input signal set, and a flip-flop latching the flip-flop input signal to store a storage datum, and outputting the digital result signal in response to the storage datum. In this case, the logic circuit preferably outputs the flip-flop input signal so as to appear an inverse of the storage datum while the input signal set is in a predetermined state, and outputs the flip-flop input signal so as to indicate the storage datum while the input signal set is not in a predetermined state.

In the case when the at least one input signal is digital, the logic circuit preferably is composed of an inverter which receives the storage datum and outputs an inverted signal indicative of an inverse of the storage datum, and an exclusive OR gate outputting the flip-flop input signal so as to indicate an exclusive OR of the at least on input signal and the inverted signal.

In order to achieve another aspect of the present invention, a semiconductor apparatus is composed of a set of n comparators responsive to 2n input signals for outputting n digital result signals, and an OR gate outputting a total result signal indicative of an OR of the n digital result signals. An i-th comparator (i being an natural number not more than n) of the n comparator is responsive to a $(2i-1)$-th input signal and a $2i$-th input signal of the $2n$ input signals for outputting an i-th digital result signal of the n digital result signals in synchronization with a clock signal. The i-th comparator inverts the i-th digital result signal at a timing indicated by the clock signal while the $(2i-1)$-th input signal and the $2i$-th input signal coincide with each other, and does not invert the digital result signal while the $(2i-1)$-th input signal and the $2i$-th input signal do not coincide with each other.

In order to achieve still another aspect of the present invention, a semiconductor apparatus is composed of a set of n comparators which is responsive to 2n input signals for outputting n digital result signals, and an AND gate outputting a total result signal indicative of an AND of the n digital result signals. An i-th comparator (i being an natural number not more than n) of the n comparator is responsive to a (2i−1)-th input signal and a 2i-th input signal of the 2n input signals for outputting an i-th digital result signal of the n digital result signals in synchronization with a clock signal. The i-th comparator inverts the i-th digital result signal at a timing indicated by the clock signal while the (2i−1)-th input signal and the 2i-th input signal coincide with each other, and does not invert the digital result signal while the (2i−1)-th input signal and the 2i-th input signal do not coincide with each other.

In order to achieve still another aspect of the present invention, a semiconductor apparatus is composed of an address generator, a test pattern generator and a comparator. The address generator provides a tested memory with an address. The test pattern generator provides the test memory with a test pattern to have an access to the address, and generates an expected pattern expected to be outputted from the tested memory. The comparator compares an output pattern from the tested memory with the expected pattern to output a digital result signal in synchronization with a clock signal. The comparator inverts the digital result signal at a timing indicated by the clock signal while the output pattern coincides with the expected pattern, and does not invert the digital result signal while the output pattern does not coincide with the expected pattern.

The tested memory and the semiconductor apparatus are preferably embedded in a single semiconductor chip.

In order to achieve still another aspect of the present invention, a semiconductor apparatus is composed of a plurality of test circuits and an OR gate. Each of the test circuits includes an address generator which provides a tested memory with an address, a test pattern generator which provides the test memory with a test pattern to have an access to the address, and generates an expected pattern expected to be outputted from the tested memory, and a comparator which compares an output pattern from the tested memory with the expected pattern to output a digital result signal in synchronization with a clock signal. The comparator inverts the digital result signal at a timing indicated by the clock signal while the output pattern coincides with the expected pattern, and does not invert the digital result signal while the output pattern does not coincide with the expected pattern. The OR gate outputs a total result signal indicative of an OR of the digital result signal.

In order to achieve still another aspect of the present invention, a semiconductor apparatus is composed of a plurality of test circuits and an AND gate. Each of the test circuits includes an address generator which provides a tested memory with an address, a test pattern generator which provides the test memory with a test pattern to have an access to the address, and generates an expected pattern expected to be outputted from the tested memory, and a comparator which compares an output pattern from the tested memory with the expected pattern to output a digital result signal in synchronization with a clock signal. The comparator inverts the digital result signal at a timing indicated by the clock signal while the output pattern coincides with the expected pattern, and does not invert the digital result signal while the output pattern does not coincide with the expected pattern. The AND gate outputs a total result signal indicative of an AND of the digital result signal.

In order to achieve still another aspect of the present invention, a method of operating a semiconductor apparatus is composed of:

providing an input signal set including at least one input signal;

outputting a digital result signal in response to the input signal set in synchronization with a clock signal; wherein the digital result signal is inverted at a timing indicated by the clock signal while the input signal set is in a predetermined state, and is not inverted while the input signal set is not in the predetermined state.

In order to achieve still another aspect of the present invention, a method of testing a circuit is composed of:

inputting an output pattern from the circuit to a semiconductor apparatus;

inputting an expected pattern to the semiconductor apparatus, the expected pattern being expected to be outputted from the circuit;

inputting a clock signal to the semiconductor apparatus;

outputting a digital result signal by the semiconductor apparatus in response to the output pattern and the expected pattern in synchronization with the clock signal, wherein the digital result signal is inverted at a timing indicated by the clock signal while the output pattern coincides with the expected pattern, and is not inverted while the output pattern does not coincide with the expected pattern.

BRIEF DESCRIPTION OF THE DRAWINGS

FIG. 3 shows a truth table of a logic circuit 1;

DESCRIPTION OF THE PREFERRED EMBODIMENTS

A semiconductor apparatus of an embodiment according to the present invention will be described below with reference to the attached drawings.

First Embodiment

The semiconductor apparatus in the first embodiment is a comparator constituted by semiconductor circuits. The comparator is used in a circuit for testing the semiconductor circuit, more preferably used for a BIST (Build In Self Test) circuit.

Figure 2:
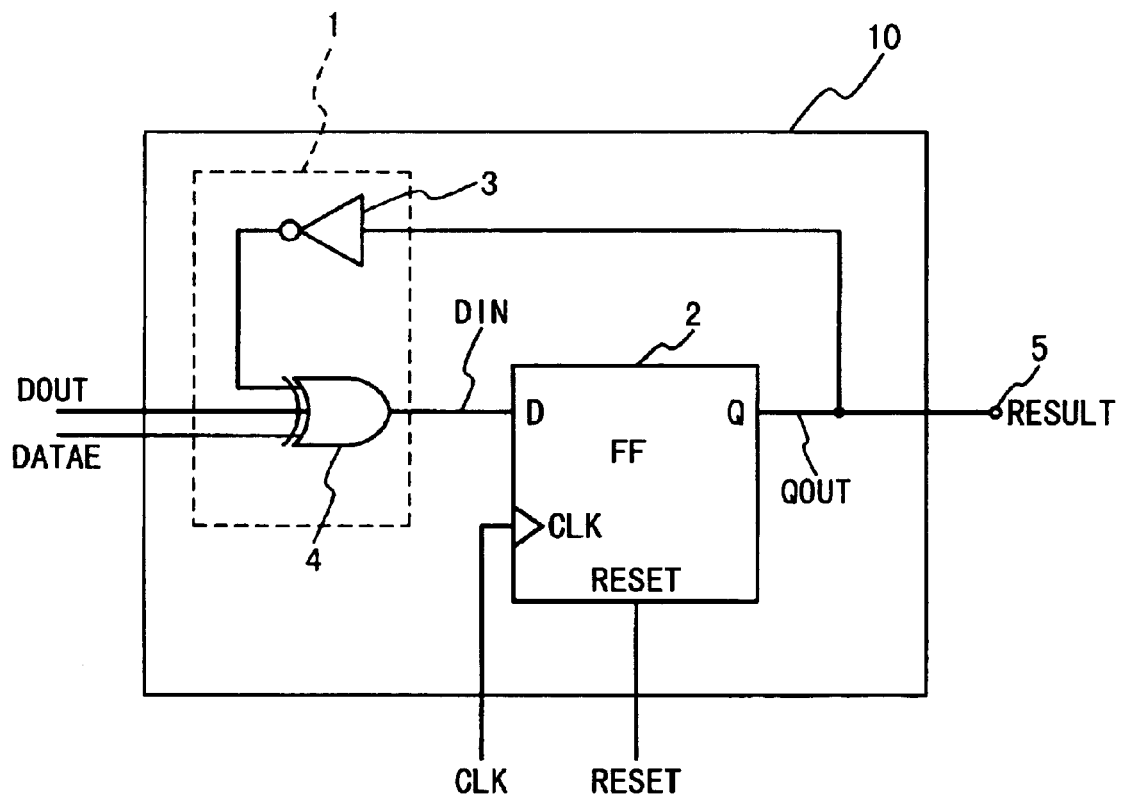
FIG. 2 is a block diagram illustrating a comparator in a first embodiment in accordance with the present invention.

FIG. 2 shows the configuration of the comparator in the first embodiment. The comparator 10 compares an output pattern DOUT with an expected pattern DATAE, the output pattern DOUT being outputted from the semiconductor circuit, and the expected pattern DATAE being expected to be outputted from the semiconductor circuit. If the output pattern DOUT and the expected pattern DATAE coincide with each other, the semiconductor circuit is proved to have no failure. The comparator 10 outputs a result signal RESULT indicative of the comparison result, that is, the comparator 10 judges whether or not the output pattern DOUT and the expected pattern DATAE coincide with each other, and outputs a result signal RESULT indicative of the judged result.

While the output pattern DOUT and the expected pattern DATAE coincide with each other, the comparator 10 inverts the result signal RESULT for each rise of a clock signal CLK. On the other hand, while the output pattern DOUT and the expected pattern DATAE do not coincide with each other, that is, the output pattern DOUT and the expected pattern DATAE disagree with each other, the comparator 10 does not invert the result signal RESULT even after the rise of the clock signal CLK, and keeps the result signal RESULT unchanged.

The comparator 10 will be described below in detail.

The comparator 10 includes the logic circuit 1 and a flip-flop 2. The logic circuit 1 includes an inverter 3 and an exclusive OR (XOR) gate 4. An input of the inverter 3 is connected to an output Q of the flip-flop 2. An output of the inverter 3 is connected to a first input of the XOR gate 4. The output pattern DOUT is inputted to a second input of the XOR gate 4. The expected pattern DATAE is inputted to a third input of the XOR gate 4. The XOR gate 4 outputs a signal DIN to an input D of the flip-flop 2.

The flip-flop 2 is triggered by rising edges of the clock signal CLK to latch the signal DIN. A "High" level (a power supply potential) of the signal DIN corresponds to a data "1", and the "Low" level (a ground potential) of the signal DIN corresponds to a data "0". The flip-flop 2 stores the digital data of "1" or "0" corresponding to the latched signal DIN.

The flip-flop 2 further includes a reset terminal RESTET. If a signal Reset of the "High" level is inputted to the reset terminal RESTET, the flip-flop 2 is reset to store the data "0".

The flip-flop 2 outputs a signal QOUT indicative of the data stored in the flip-flop 2 from an output Q. The flip-flop 2 sets the signal QOUT at the "High" level when storing the data "1", and sets the signal QOUT at the "Low" level when storing the data "0". The output Q of the flip-flop 2 is connected to an output terminal 5.

The result signal RESULT is outputted from the output terminal 5. The result signal RESULT coincides with the signal QOUT outputted by the flip-flop 2.

The operation of the comparator 10 will be described below.

FIG. 3 shows a truth table of the logic circuit 1. The logic circuit 1 outputs the inverse of the signal QOUT outputted by the flip-flop 2 as the signal DIN, while the output pattern DOUT and the expected pattern DATAE coincide with each other. The flip-flop 2 is triggered by the rising edge of the clock signal CLK to latch the signal DIN, and the signal QOUT is inverted for each rising edge of the clock signal CLK while the output pattern DOUT and the expected pattern DATAE coincide with each other. The result signal RESULT, which is identical to the signal QOUT, is also inverted for each rise of the clock signal CLK while the output pattern DOUT and the expected pattern DATAE coincide with each other.

On the other hand, the logic circuit 1 outputs the signal QOUT identical to the signal DIN while the output pattern DOUT and the expected pattern DATAE do not coincide with each other. The data stored in the flip-flop 2 is not inverted, and is kept unchanged while the output pattern DOUT and the expected pattern DATAE disagree with each other. The result signal RESULT, which is identical to the signal QOUT outputted by the flip-flop 2, is kept unchanged.

Inversions of the result signal RESULT for each rise of the clock signal CLK imply that the expected pattern DATAE and the output pattern DOUT coincide with each other.

On the other hand, if the result signal RESULT is not inverted for every rise of the clock signal CLK, it implies that the output pattern DOUT and the expected pattern DATAE disagree with each other or that the comparator 10 has any failure. Another inspection on the basis the result signal RESULT may be needed to distinguish disagreement of the output pattern DOUT and the expected pattern DATAE from the failure of the comparator 10.

The operation of the comparator 10 substantially eliminates the possibility of erroneously judging that the output pattern DOUT and the expected pattern DATAE coincide with each other as the result of the failure in the comparator 10. The operation of inverting the result signal RESULT for each rise of the clock signal CLK by the comparator 10 is substantially impossible when the comparator 10 has a failure. As for the simple semiconductor circuit such as a flip-flop, an inverter, and a basic logic gate, a signal line through which the semiconductor circuit outputs a signal is fixed to the "High" level (power supply potential), the "Low" level (ground level) or the high impedance state, the high impedance state implying the signal line is electrically isolated from the power supply potential and the ground level. Therefore, if the comparator 10 has a failure, the result signal RESULT is fixed to the "High" level, the "Low" level, or the high impedance state. This implies the possibility that the comparator 10 has a failure is substantially 0 when the comparator 10 carries out the operation for inverting the result signal RESULT for each rise of the clock signal CLK.

As is described, the comparator 10 in the embodiment carries out the operation for inverting and outputting the result signal RESULT for each rise of the clock signal CLK. The inversions of result signal RESULT for each rise of the clock signal CLK proves that the output pattern DOUT and the expected pattern DATAE coincide with each other, and also that the comparator 10 has no failure.

An example of the operation of the comparator 10 is described with reference to a timing chart shown in FIG. 4.

Period t<$t_0$:

A signal of the "High" level is inputted to the RESTET terminal of the flip-flop 2, and the flip-flop 2 is reset. The flip-flop 2 stores the data "0", and the result signal RESULT becomes at the "Low" level.

Period $t0 \leq t < t_2$:

At the time $t_0$, the provision of the output pattern DOUT and the expected pattern DATAE is started. While $t_0 \leq t < t_2$, the output pattern DOUT and the expected pattern DATAE are both at the "High" level. In the period from the time $t_0$ to the time $t_2$, the output pattern DOUT and the expected pattern DATAE coincide with each other. The signal DIN inputted to the flip-flop 2 becomes the inverse of the signal QOUT outputted from the flip-flop 2. Thus, the flip-flop 2 inverts the signal QOUT for each rise of the clock signal CLK. The "High" level and the "Low" level alternately appear in the result signal RESULT, due to the inversions for each rise of the clock signal CLK.

Period $t_2 \leq t < t_3$:

At the time $t_2$, the output pattern DOUT is pulled down to the "Low" level. Then, at a time $t_{31}$, the clock signal CLK is pulled up to the "High" level. At the time $t_{31}$, the output pattern DOUT and the expected pattern DATAE disagree with each other. Thus, at the time $t_{31}$, the signal QOUT outputted from the flip-flop 2 is identical to signal DIN inputted to the flip-flop 2. At the time $t_{31}$, the flip-flop 2 does not invert the signal QOUT, and the signal QOUT is kept unchanged even if the clock signal CLK is pulled up. The result signal RESULT is also kept unchanged. The fact that the result signal RESULT is not inverted even after the rise of the clock signal CLK suggests the output pattern DOUT and the expected pattern DATAE do not coincide with each other.

After that, at a time $t_{32}$, the output pattern DOUT is pulled up to the "High" level. In a period from the time $t_{32}$ to the time $t_3$, the output pattern DOUT and the expected pattern DATAE coincide with each other. In the period from the time $t_{32}$ to the time $t_3$, the result signal RESULT is also inverted for each rise of the clock signal CLK.

Period $t \geq t_3$:

In the period $t \geq t_3$, the output pattern DOUT and the expected pattern DATAE coincide with each other. The flip-flop 2 outputs the signal QOUT while inverting the signal QOUT for each rise of the clock signal CLK. The result signal RESULT is also inverted for each rise of the clock signal CLK.

The result signal RESULT having the abovementioned waveform proves that the tested semiconductor circuit has a failure, while the comparator 10 implements a normal operation.

At first, in the period $t_0 \leq t < t_2$, the "High" level and the "Low" level alternately appears in the result signal RESULT, and the signal QOUT is inverted for each rise of the clock signal CLK. This proves that the normal operation of the comparator 10 is achieved. As mentioned above, the signal lines of the comparator 10 is fixed to the "High" level, the "Low" level or the high impedance state when the comparator 10 has a failure. When having a failure, the comparator 10 is substantially impossible to carry out the operation for inverting the result signal RESULT for each rise of the clock signal CLK.

For example, let us suppose an output of the XOR gate 4 is fixed to the "High" level. In this case, the flip-flop 2 always latches the signal DIN of the "High" level. The flip-flop 2 continues to output the "High" level for the signal QOUT. The result signal RESULT is also fixed to the "High" level. Similarly, when the output of the flip-flop 2 or the inverter 3 is fixed to a certain state, this results in that the result signal RESULT is fixed to a constant state.

Moreover, there is the period in which the result signal RESULT is not inverted even after the rise of the clock signal CLK during the period $t_2 \leq t < t_3$. This proves the tested semiconductor circuit has a failure. The normal operation of the comparator 10 is determined from the result signal RESULT outputted in the period $t_0 \leq t < t_2$, and therefore the non-inverting result signal RESULT proves the existence of the failure in the tested semiconductor circuit.

The test result indicated by the result signal RESULT can be classified into the following three cases.

If the result signal RESULT is inverted for every rise of the clock signal CLK, it proves that the output pattern DOUT and the expected pattern DATAE perfectly coincide with each other so that both the semiconductor circuit targeted for the test and the comparator 10 are normally operated.

On the other hand, as shown in FIG. 3, if the result signal RESULT is inverted for each rise of the clock signal CLK in a certain period and not inverted even after the rise of the clock signal CLK in another period, it proves that the tested semiconductor circuit has a failure while although the comparator 10 is normal. If the comparator 10 has a failure, it can not be considered that the operation for inverting the result signal RESULT for each rise of the clock signal CLK is carried out even in the transient manner.

Also, if the result signal RESULT is not inverted at all even after the rise of the clock signal CLK, it is not possible to judge which of the tested semiconductor circuit and the comparator 10 has any failures. In order to determine which of the tested semiconductor circuit and the comparator 10 has any failures, it is necessary to judge by inspecting each of them. In the embodiment, it is only this case that requires the separate inspection with regard to the tested semiconductor circuit and the comparator 10, in order to determine which of the tested semiconductor circuit and the comparator 10 has any failures. If it is not necessary to determine which of the tested semiconductor circuit and the comparator 10 has any failures, it is not necessary to singly inspect the comparator 10.

Figure 1:
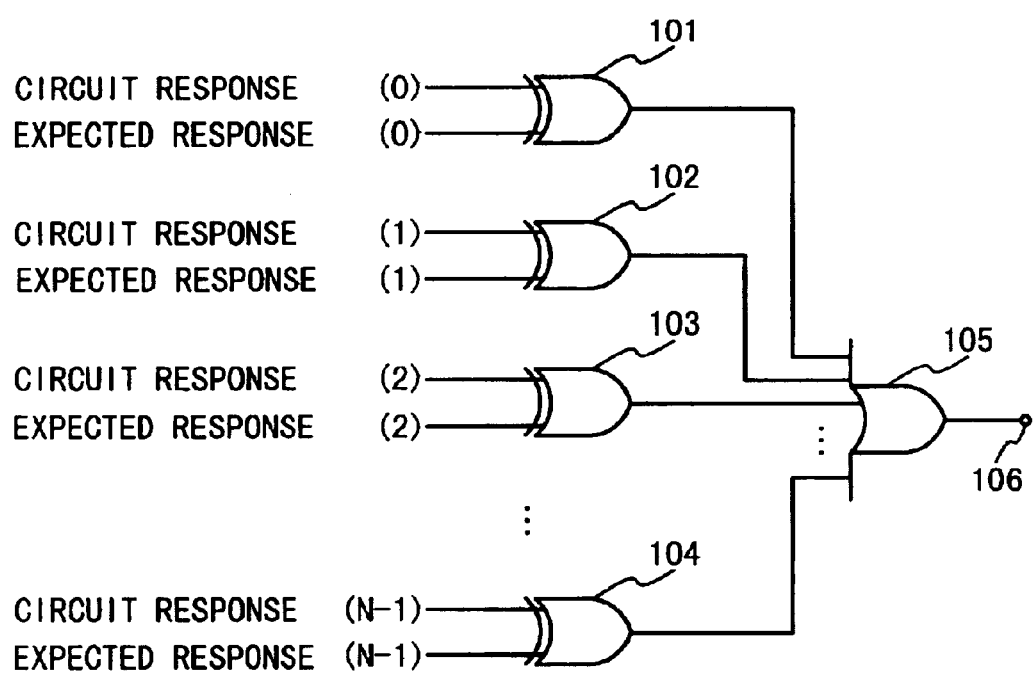
FIG. 1 is a conventional data analyzer.

In this way, differently from the conventional comparison analysis circuit shown in FIG. 1, the possibility that the signal indicative of the normal operation of the tested semiconductor circuit appears in the result signal RESULT while the tested semiconductor circuit has the failure is substantially perfectly removed in this embodiment. If the signal indicative of the normal operation of the tested semiconductor circuit appears in the result signal RESULT, it is not necessary to again inspect the comparator 10 and then confirm the normal operation of the comparator 10. In this way, the comparator 10 in this embodiment can test the comparator 10 itself while testing the semiconductor. The usage of the comparator 10 in the embodiment enables the semiconductor circuit to be effectively inspected. The comparator 10 in the embodiment having such feature is especially suitable for the usage in a BIST (Built In Self Test) circuit requiring a high reliability.

When comparator 10 in the embodiment is used to inspect a plurality of semiconductor circuits, the comparator 10 in this embodiment is provided to each of the plurality of semiconductor circuits. If the plurality of comparators 10 are provided, it is possible to integrate the result signals outputted by the comparators 10 into a single signal, and effectively inspect the plurality of semiconductor circuits.

Figure 5:
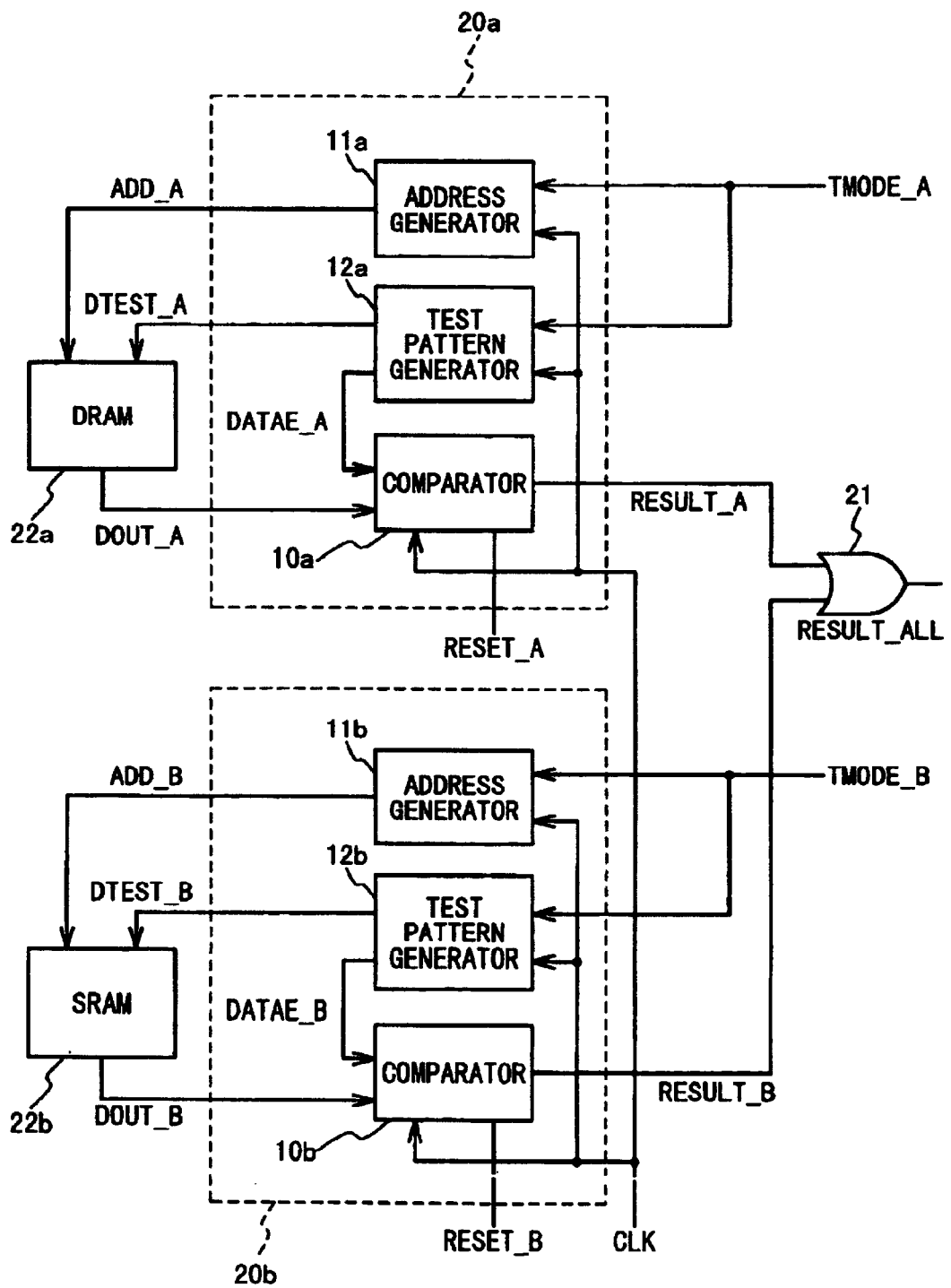
FIG. 5 shows an inspecting circuit of the first embodiment according to the present invention.

FIG. 5 shows a semiconductor apparatus in which a plurality of BIST (Built In Self Test) circuits each including a comparator having the same configuration as the abovementioned comparator 10 are mounted. The semiconductor apparatus includes BIST circuits 20a, 20b and an OR gate 21. The BIST circuits 20a, 20b and an OR gate 21 are provided for testing a DRAM 22a and a SRAM 22b, and The BIST circuits 20a, 20b, the OR gate 21, the DRAM 22a and the SRAM 22b are embedded in a single semiconductor chip.

The BIST circuit 20a tests the DRAM 22a, and outputs a result signal RESULT_A indicative of the test result. The BIST circuit 20a, while judging that the DRAM 22a is normally operated, inverts the result signal RESULT_A for each rise of the clock signal CLK. The BIST circuit 20a, while judging that the DRAM 22a is not normally operated, does not invert the result signal RESULT_A even if the clock signal CLK is risen, and keeps the result signal RESULT_A unchanged.

The BIST circuit 20b tests the SRAM 22b, and outputs a result signal RESULT_B indicative of the test result. The BIST circuit 20b, while judging that the SRAM 22b is normally operated, inverts the result signal RESULT_B for each rise of the clock signal CLK from the "Low" level to the "High" level. The BIST circuit 20b, while judging that the SRAM 22b is not normally operated, does not invert the result signal RESULT_B even if the clock signal CLK is risen, and keeps the result signal RESULT_B unchanged.

Both the result signal RESULT_A and the result signal RESULT_B are digital signals. The result signal RESULT_A and the result signal RESULT_B are inputted to the OR gate 21.

The OR gate 21 outputs a total result signal RESULT_All indicative of the OR of the result signal RESULT_A and the result signal RESULT_B. As a result, if both the DRAM 22a and the SRAM 22b are normally operated, the total result signal RESULT_All is inverted for each rise of the clock signal.

The configuration of the BIST circuit 20a is described in detail. The BIST circuit 20a includes an address generator 11a, a test pattern generator 12a and a comparator 10a. The comparator 10a has the same configuration as the above comparator 10 having the configuration shown in FIG. 1, and carries out the same operation.

The address generator 11a outputs an address signal ADD_A to the DRAM 22a. The address signal ADD_A indicates an address of the DRAM 22a from and to which data is read and written.

The operation of the address generator 11a is allowed by a signal TMODE_A. The address generator 11a outputs the address signal ADD_A to the DRAM 22a while the signal TMODE_A is at the "High" level. While the signal TMODE_A is at the "Low" level, the address generator 11a does not output the address signal ADD_A.

The test pattern generator 12a outputs a test pattern DTEST_A to the DRAM 22a. Moreover, the test pattern generator 12a generates an expected pattern DOUT_A expected to be outputted by the DRAM 22a, and outputs to the comparator 10a.

The operation of the test pattern generator 12a is allowed by the signal TMODE_A. The test pattern generator 12a outputs the test pattern DTEST_A to the DRAM 22a while the signal TMODE_A is at the "High" level. The test pattern generator 12a does not output the test pattern DTEST_A while the signal TMODE_A is at the "Low" level.

The address signal ADD_A and the test pattern DTEST_A, which are respectively generated by the address generator 11a and the test pattern generator 12a, are inputted to the DRAM 22a. The DRAM 22a writes the data indicated by the test pattern DTEST_A to an address indicated by the address signal ADD_A. In succession, the DRAM 22a reads the data from the address, and outputs an output pattern DOUT_A to the comparator 10a of the BIST circuit 20a.

The comparator 10a has the same configuration as the comparator 10 shown in FIG. 1, and carries out the same operation. That is, the comparator 10a inverts the result signal RESULT_A for each rise of the clock signal CLK while the output pattern DOUT_A and the expected pattern DATAE_A coincide with each other. On the other hand, while the output pattern DOUT_A and the expected pattern DATAE_A do not coincide with each other, the comparator 10a does not invert the result signal RESULT_A even after the rise of the clock signal CLK, and keeps the result signal RESULT_A unchanged. When the signal Reset_A is set at the "High" level, the comparator 10a is set at the state for outputting the result signal RESULT_A at the "Low" level.

The BIST circuit 20b has the same configuration as the BIST circuit 20a and carries out the same operation as the BIST circuit 20a except for testing the SRAM 22b instead of the DRAM 22a. The BIST circuit 20b includes an address generator 11b, a test pattern generator 12b and a comparator 10b. The comparator 10b has the same configuration as the above comparator 10 having the configuration shown in FIG. 1, and carries out the same operation. The detailed explanation of the BIST circuit 20b is not done.

Figure 4:
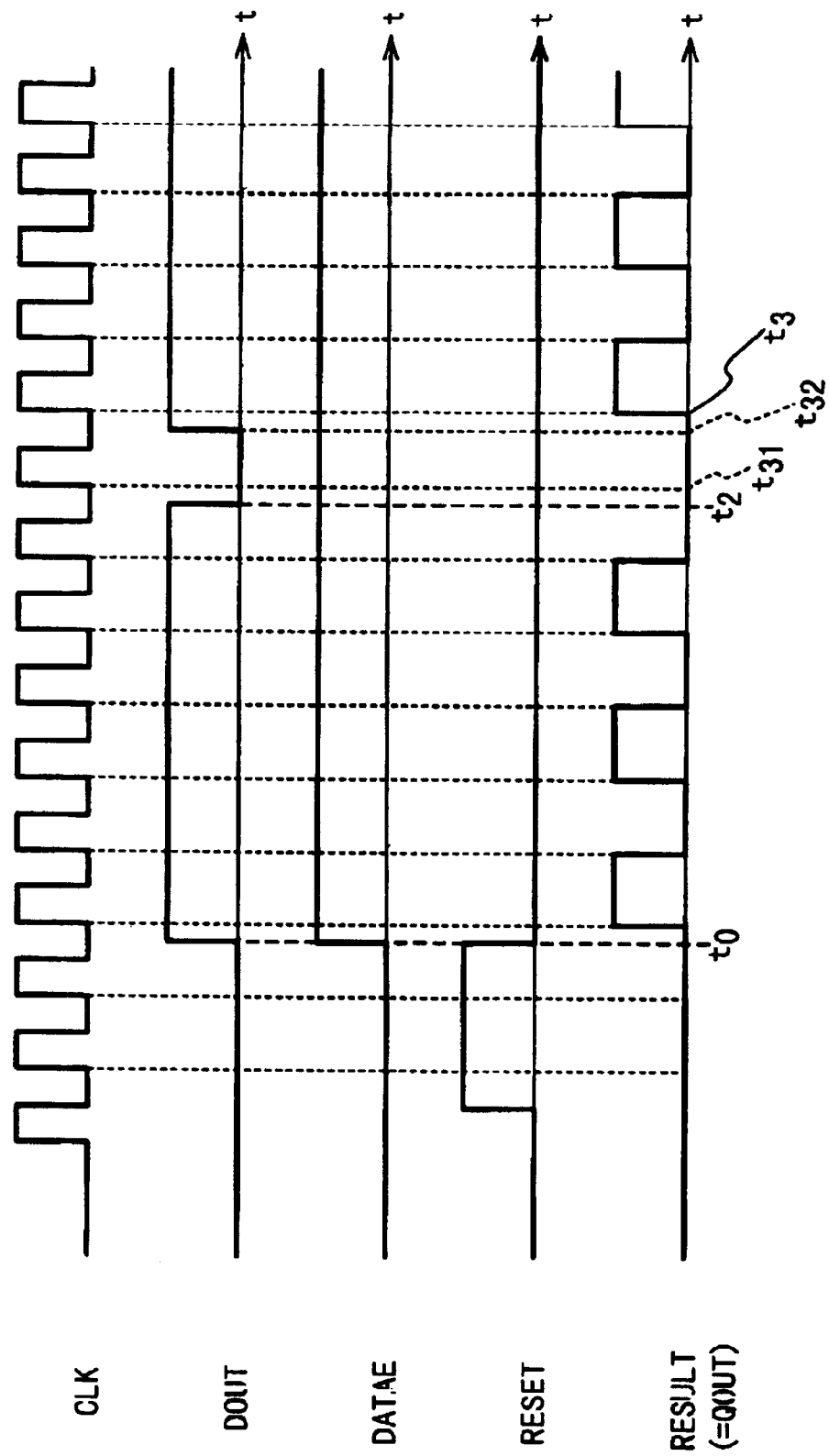
FIG. 4 is a timing chart showing an operation of the comparator of the first embodiment according to the present invention.

In succession, the process for inspecting the DRAM 22a and the SRAM 22b by using the BIST circuits 20a, 20b shown in FIG. 4 is described.

At first, an operation test of the BIST circuit 20a is carried out (Step S01). A signal TMODE_A is set at the "High" level for a certain period. While the signal TMODE_A is at the "High" level, a test pattern DTEST_A is written to a memory cell of the DRAM 22a selected in accordance with an address signal ADD_A generated by the address generator 11a. After that, the data of the memory cell selected in accordance with the address signal ADD_A is read, and the read data is outputted to the comparator 10a as an output pattern DOUT_A. Moreover, an expected pattern DATAE_A is generated and outputted to the comparator 10a. The comparator 10a compares the output pattern DOUT$_{13}$ A with the expected pattern DATAE_A, and a result signal RESULT_A is generated. If the result signal RESULT_A is inverted for each rise of the clock signal CLK, the comparator 10a is judged to be normal.

The test pattern DTEST_A generated for the operation test of the BIST circuit 20a does not require the length that substantially enables the normal operation of the DRAM 22a to be perfectly determined. It is sufficient that the test pattern DTEST_A has the length that substantially enables the normal operation of the comparator 10a to be judged. The signal TMODE_A is set at the "High" level for a time while it is possible to substantially confirm the normal operation of the comparator 10a.

In succession, the operation test of the BIST circuit 20b is done (Step S02). The operation test of the BIST circuit 20b is done similarly to that of the BIST circuit 20a. That is, a signal TMODE_B is set at the "High" level for a time while it is possible to substantially confirm the normal operation of the comparator 10b.

Figure 6:
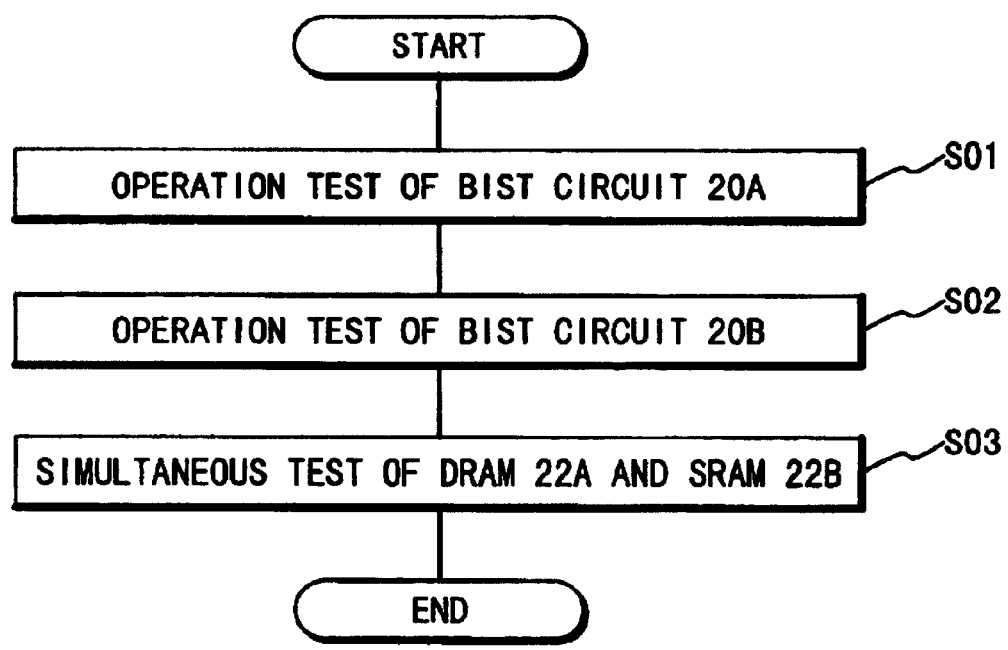
FIG. 6 is a flowchart showing a procedure of an inspection using the inspecting circuit of the first embodiment according to the present invention.
Figure 7:
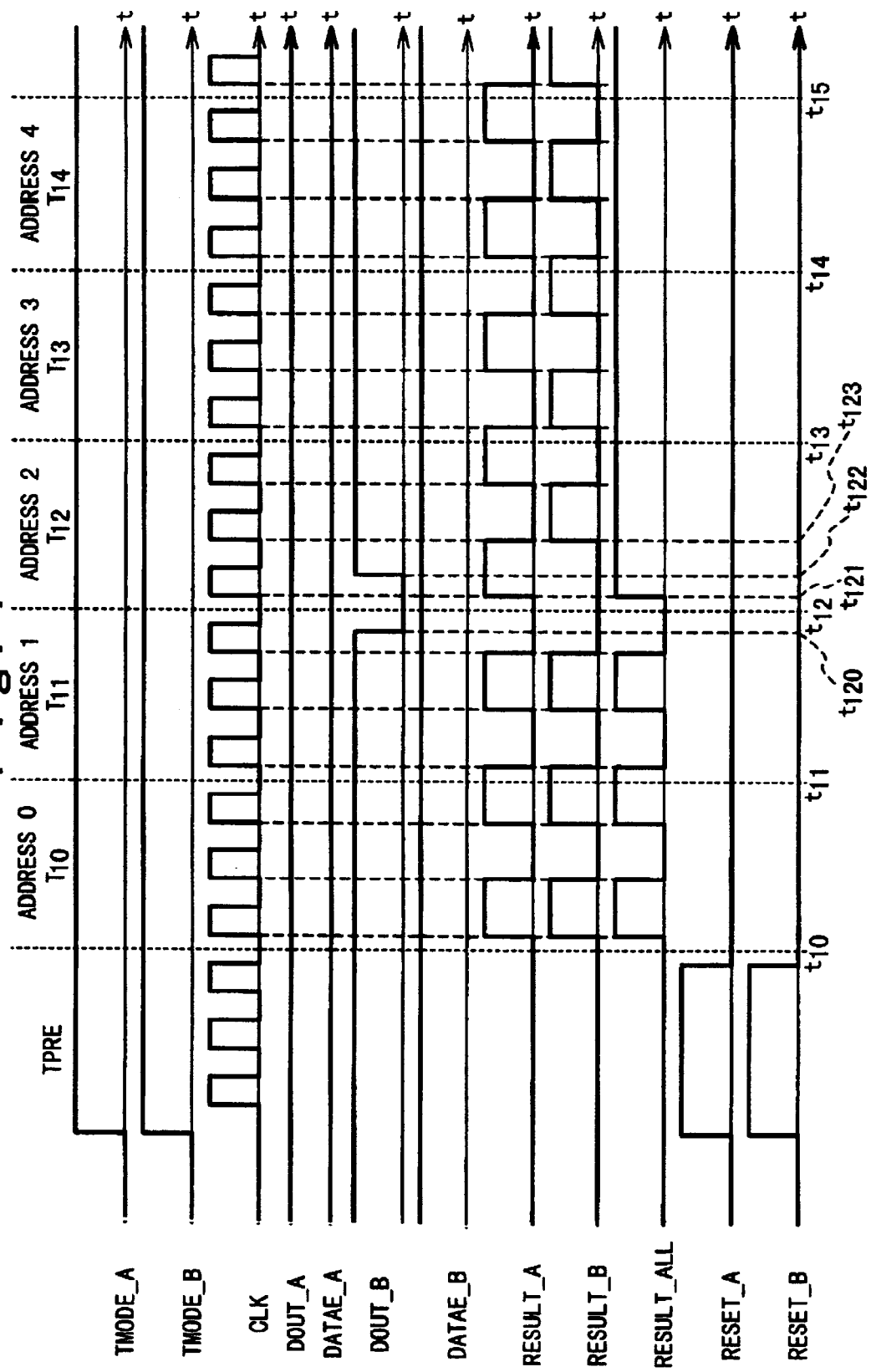
FIG. 7 is a timing chart showing an operation of the inspecting circuit of the first embodiment according to the present invention.

In succession, the DRAM 22a and the SRAM 22b are tested at the same time (Step S03). FIG. 6 is a timing chart showing the process for testing the DRAM 22a and the SRAM 22b at the step S03. Here, the comparison between the expected pattern and the output pattern is done every three clocks. Typically, in the BIST circuit, an operation for writing and reading a data is carried out for one address. Therefore, two clocks or more are required as a temporal interval for the comparison between the expected pattern and the output pattern. Here, the operation in which the comparison between the output pattern and the expected pattern is done every three clocks is described.

Period $T_{pre}$ (t<$t_{10}$):

The signal TMODE_A and the signal TMODE_B are set at the "High" level, and both the BIST circuits 20a, 20b are set at an enabled state. Moreover, Signals Reset_A, Reset_B are set at the "High" level. Both the comparators 10a, 10b are set at the state for outputting the "Low" level.

Period $T_{10}$, $T_{11}$ ($t_{10} \leq t < t_{12}$)

The data of an address 0 and an address 1 are inputted in order from the DRAM 22a and the SRAM 22b to the BIST circuits 20a, 20b, respectively.

The expected pattern DATAE_A and the output pattern DOUT_A, which are outputted from the DRAM 22a, are both at the "Low" level for the periods $T_{10}$, $T_{11}$ and coincide with each other. The result signal RESULT_A outputted by the comparator 10a is inverted for each rise of the clock signal CLK.

Similarly, the expected pattern DATAE_B and the output pattern DOUT_B, which are outputted from the SRAM 22b, are both at the "High" level for the periods $T_{10}$, $T_{11}$, and coincide with each other. The result signal RESULT_B outputted by the comparator 10b is inverted for each rise of the clock signal CLK.

The total result signal RESULT_All is the OR of the result signal RESULT_A and the result signal RESULT_B. Thus, the total result signal RESULT_All is inverted for each rise of the clock signal CLK.

The total result signal RESULT_All proves that both the DRAM 22a and the SRAM 22b have no failure, in the address 0 and the address 1.

At a time $t_{12}$ when the period $T_{11}$ ends, the data to be used to test an address 2 is inputted to the BIST circuits 20a, 20b on the basis of the output pattern DOUT_A and the output pattern DOUT_B. At the time $t_{120}$ just before the time $t_{12}$, the output pattern DOUT_A is kept at the "Low" level. The output pattern DOUT_B is pulled down to the "Low" level.

Period $T_{12}$ ($t_{12} \leq t < t_{13}$)

The data of the address 2 is inputted from the DRAM 22a and the SRAM 22b to the BIST circuits 20a, 20b, respectively. As mentioned above, at the time $t_{12}$, both of the output pattern DOUT_A and DOUT_B are at the "Low" level.

At a time $t_{121}$ just after the time $t_{12}$, the clock signal CLK is pulled up to the "High" level. At the time $t_{121}$, the output pattern DOUT_A and the expected pattern DATAE_A coincide with each other. The result signal RESULT_A outputted by the comparator 10a is inverted at the time $t_{121}$.

On the other hand, the output pattern DOUT_B and the expected pattern DATAE_B do not coincide with each other. The result signal RESULT_B outputted by the comparator 10b is not inverted even after the rise of the clock signal CLK at the time $t_{121}$. The result signal RESULT_B is kept unchanged at the "Low" level.

The total result signal RESULT_All, which indicates the OR of the result signal RESULT_A and the result signal RESULT_B, is pulled up to the "High" level in response to the pull-up of the result signal RESULT_A.

In succession, at a time $t_{122}$, the output pattern DOUT_B is pulled up to the "High" level.

After that, at a time $t_{123}$, the clock signal CLK is pulled up to the "High" level. At the time $t_{123}$, the output pattern DOUT_A and the expected pattern DATAE_A coincide with each other. The result signal RESULT_A outputted by the comparator 10a is inverted at the time $t_{123}$, and pulled down to the "Low" level.

Similarly, at the time $t_{122}$, the output pattern DOUT_B and the expected pattern DATAE_B coincide with each other. The result signal RESULT_B outputted by the comparator 10b is inverted at the time $t_{122}$. The result signal RESULT_B is pulled down to the "High" level.

The total result signal RESULT_All, which indicates the OR of the result signal RESULT_A and the result signal RESULT_B, is kept at the "High" level in response to the pull-up of the output pattern DOUT_B.

During the period from the time $t_{122}$ to the time $t_{13}$, the output pattern DOUT_A and the expected pattern DATAE_A coincide with each other, and the output pattern DOUT_B and the expected pattern DATAE_B coincide with each other. As a result, the result signal RESULT_A and the result signal RESULT_B are both inverted at the time $t_{123}$ when the clock signal CLK is pulled up. However, at the time $t_{123}$, although the result signal RESULT_B is pulled down to the "Low" level, the result signal RESULT_A is pulled up to the "High" level. Thus, the total result signal RESULT_All is also kept at the "High" level.

On and after the time $t_{121}$, the total result signal RESULT_All is fixed to the "High" level because of the existence of the period in which the output pattern DOUT_B and the expected pattern DATAE_B do not coincide with each other. The total result signal RESULT_All, which is fixed to the "High" level, proves that there is a failure in any address 2 of the DRAM 22a and the SRAM 22b.

Period $T_{13}$, $T_{14}$ ($t \geq t_{13}$)

The output pattern DOUT_A and the expected pattern DATAE_A coincide with each other, and the output pattern DOUT_B and the expected pattern DATAE_B coincide with each other. As a result, the result signal RESULT_A and the result signal RESULT_B are both inverted for each rise of the clock signal CLK.

However, the result signal RESULT_A and the result signal RESULT_B are alternately set to the "High" level. Consequently, the total result signal RESULT_All is successively kept at the "High" level.

As explained above, in the semiconductor apparatus shown in FIG. 5, only from the total result signal RESULT_All, it is possible to judge whether both of the DRAM 22a and the SRAM 22b have no failure, or one of them has a failure. If the total result signal RESULT_All is always inverted for each rise of the clock signal CLK, it proves that both of the DRAM 22a and the SRAM 22b have no failure. If there is the period in which the total result signal RESULT_All is not inverted even after the rise of the clock signal CLK, it proves that one of the DRAM 22a and the SRAM 22b has a failure. In the semiconductor apparatus in which such a judgment can be done only from the total result signal RESULT_All, it is possible to reduce the test time. The semiconductor apparatus is preferably used for a LSI to which a DRAM and a SRAM are embedded. A BIST circuit is usually unable to test both a DRAM and a SRAM. The configuration mentioned above enables the simultaneous test of a DRAM and a SRAM by BIST circuits.

In the semiconductor apparatus shown in FIG. 5, the OR gate 21 can be replaced by an AND gate. Also in such a case, only from the total result signal RESULT_All, it is possible to judge whether both of the DRAM 22a and the SRAM 22b have no failure, or one of them has a failure.

As mentioned above, the semiconductor apparatus shown in FIG. 5 includes the two BIST circuits. However, it should be understood that the semiconductor apparatus may include three or more BIST circuits.

Second Embodiment

Figure 8:
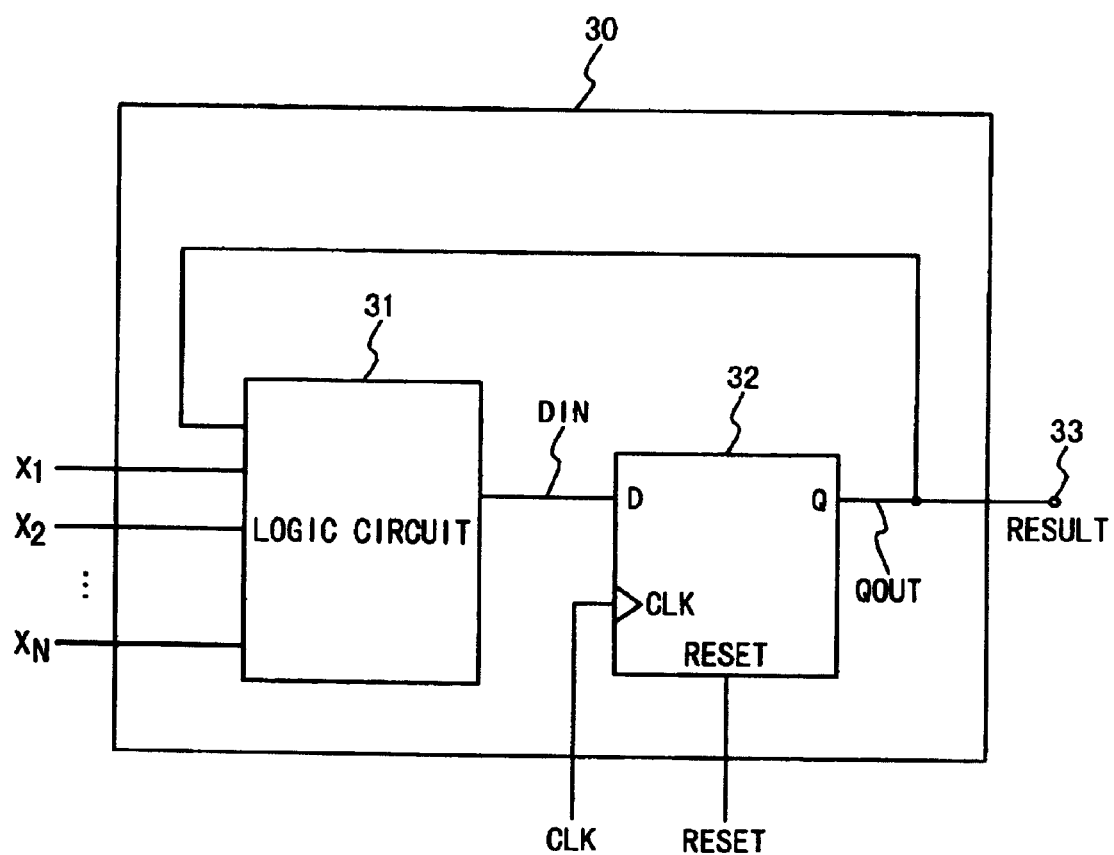
FIG. 8 shows a data analyzer in a second embodiment in accordance with the present invention.

A semiconductor apparatus in the second embodiment in accordance with the present invention is a data analyzer consisting of semiconductor circuits. FIG. 8 shows the configuration of the data analyzer in the second embodiment.

A data analyzer 30 in the embodiment judges whether or not input signals X1 to XN inputted thereto are at a predetermined state. All of the input signals $X_1$ to $X_N$ are digital signals.

The data analyzer 30 includes a logic circuit 31 and a flip-flop 32.

The input signals $X_1$ to $X_N$ and an output signal QOUT outputted from an output Q of the flip-flop 32 are inputted to the logic circuit 31, N being a natural number. The logic circuit 31 outputs a signal DIN indicative of an inverse of the output signal QOUT while the input signals $X_1$ to $X_N$ are at the predetermined state. On the other hand, the logic circuit 31 outputs the signal DIN identical to the output signal while the input signals $X_1$ to $X_N$ are not at the predetermined state.

The flip-flop 32 latches the signal DIN for each rise of the clock signal CLK. The flip-flop 32 stores a digital data which is "1" or "0" indicated by the signal DIN.

The flip-flop 32 further includes a reset terminal RESET. When a signal of the "High" level is inputted to the reset terminal RESTET, the flip-flop 32 is reset to store the data "0"

The flip-flop 32 outputs the signal QOUT indicative of the data stored therein from the output Q. The flip-flop 32, while storing the data "1", outputs the signal QOUT at the "High" level. The flip-flop 32, while storing the data "0" outputs the signal QOUT at the "Low" level. The output Q of the flip-flop 32 is connected to an output terminal 33.

A result signal RESULT indicating whether or not the input signals $X_1$ to $X_N$ are at the predetermined state is outputted from the output terminal 33. The result signal RESULT coincides with the signal QOUT outputted by the flip-flop 32.

The data analyzer 30 inverts the result signal RESULT for each of the rise of the clock signal CLK while the input signals $X_1$ to $X_N$ are at the predetermined state. While the input signals $X_1$ to $X_N$ are not at the predetermined state, the data analyzer 30 does not invert the result signal RESULT even after the rise of the clock signal CLK.

The operation of the data analyzer enables to prove not only that the input signals $X_1$ to $X_N$ are at the predetermined state but also that the data analyzer 30 has no failure. If the result signal RESULT is inverted for each rise of the clock signal CLK, it proves that the input signals $X_1$ to $X_N$ are at the predetermined state and the data analyzer 30 has no failure, as is explained in the first embodiment.

FIG. 8 shows an example of the data analyzer 30. Hereafter, the data analyzer 30 shown in FIG. 8 is referred to as a data analyzer 30a.

The data analyzer 30a is the judging circuit for judging whether or not the input signal $X_1$ is at the "High" level. The data analyzer 30a includes an XOR gate 31a and a flip-flop 32a.

The output signal QOUT outputted from the output Q of the flip-flop 32a is inputted to a first input of the XOR gate 31a. The input signal X1 is inputted to a second input of the XOR gate 31b. The XOR gate 31a outputs a signal DIN, which is an exclusive-OR (XOR) between the output signal QOUT and the input signal $X_1$.

The flip-flop 32a latches the signal DIN for each rise of the clock signal CLK, and outputs the output signal QOUT from the output Q. The output Q of the flip-flop 32a is connected to the output terminal 33. The result signal RESULT, which is identical to the output signal QOUT, is outputted from the output terminal 33.

The data analyzer 30a, while the input signal $X_1$ is at the state of the "High" level, inverts the result signal RESULT for each rise of the clock signal CLK. On the other hand, while the input signal $X_1$ is not at the state of the "High" level, the data analyzer 30a does not invert the result signal RESULT even after the rise of the clock signal CLK, and keeps the result signal RESULT unchanged.

Figure 9:
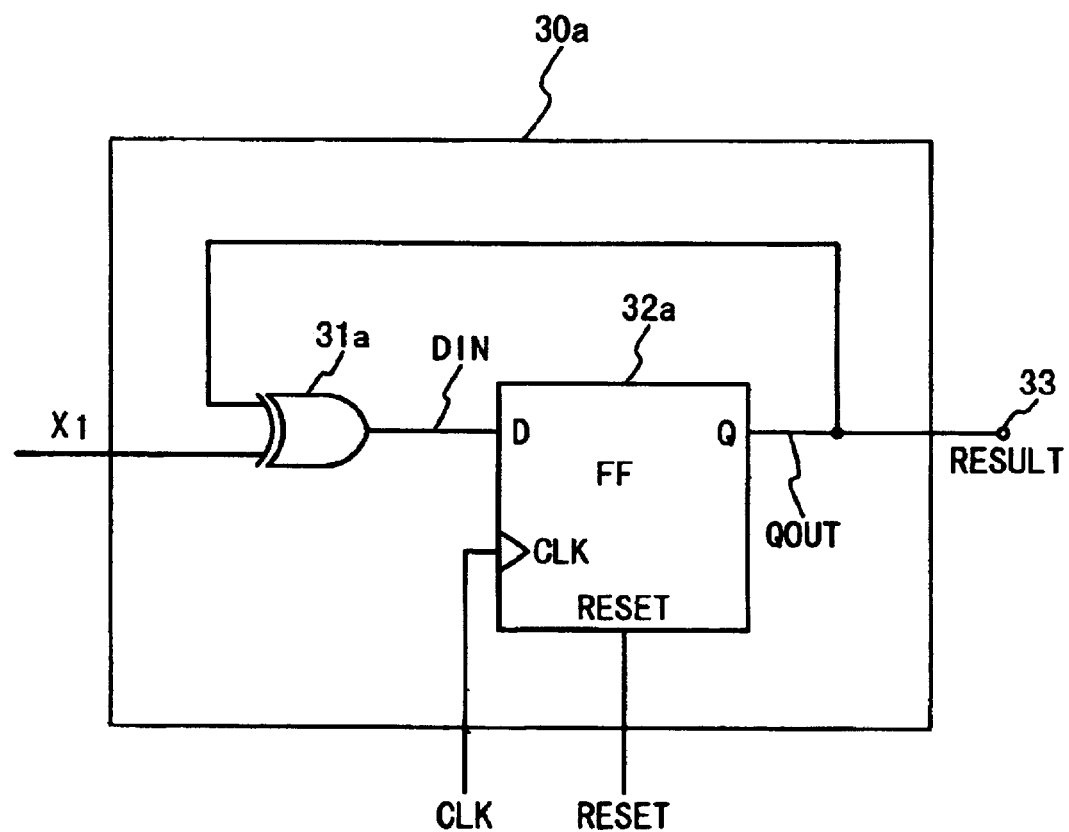
FIG. 9 shows an example of the data analyzer in the second embodiment.

The data analyzer 30a enables to prove that the input signal $X_1$ is at the "High" level from the operation that the result signal RESULT is inverted for each rise of the clock signal CLK. Moreover, the inversion of the result signal RESULT proves that the data analyzer 30a has no failure. If an inverter would be used instead of the data analyzer 30a, a signal outputted by the inverter would be at the "Low" level and the input signal $X_1$ would be judged to be at the "High" level from the output of the inverter. However, it is impossible to deny the possibility that the failure of the inverter causes the output thereof to be fixed to the "Low" level. In the data analyzer 30a shown in FIG. 9, it is possible to substantially eliminate the possibility that the failure of the data analyzer 30a causes the input signal $X_1$ to be erroneously recognized as the state of the "High" level.

As mentioned above, the present invention provides a comparing circuit in which it is possible to eliminate the possibility that comparison signals are recognized to be identical because of a failure of the comparing circuit.

Also, the present invention provides a comparing circuit, a failure of which is easily detected.

Also, the present invention provides the comparing circuit in which when the comparing circuit is used to test the semiconductor apparatus, it is possible to reduce the time required to test the semiconductor apparatus.

Also, the present invention provides a comparing circuit that enable to simultaneously prove that a plurality of the signals coincide with each other and that the comparing circuit itself has no failure.

Also, the present invention provides a data analyzer for judging whether or not a signal is at a predetermined state, a failure of which is easily detected.

Also, the present invention provides a data analyzer that enables to simultaneously prove that a signal(s) is at some state and that the data analyzer itself has no failure.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor apparatus comprising:
   a set of n comparators which is responsive to 2n input signals for outputting n digital result signals, wherein an i-th comparator where i is an natural number not more than n of said n comparator is responsive to a (2i−1)-th input signal and a 2i-th input signal of said 2n input signals for outputting an i-th digital result signal of said n digital result signals in synchronization with a clock signal; and
   an OR gate outputting a total result signal indicative of an OR of said n digital result signals, wherein
   said i-th comparator inverts said i-th digital result signal at a timing indicated by said clock signal while said (2i−1)-th input signal and said 2i-th input signal coincide with each other, and does not invert said digital result signal while said (2i−1)-th input signal and said 2i-th input signal do not coincide with each other.

2. The semiconductor apparatus according to claim 1, wherein said i-th comparator includes:
   a logic circuit outputting a flip-flop input signal in response to said (2i−1)-th input signal and said 2i-th input signal, and
   a flip-flop latching said flip-flop input signal to store a storage datum, and outputting said i-th digital result signal in response to said storage datum, and
   wherein said logic circuit outputs said flip-flop input signal so as to indicate an inverse of said storage datum while said (2i−1)-th input signal and said 2i-th input signal coincide with each other, and outputs said flip-flop input signal so as to indicate said storage datum while said (2i−1)-th input signal and said 2i-th input signal do not coincide with each other.

3. The semiconductor apparatus according to claim 2, wherein said logic circuit includes;

an inverter which receives said storage datum and outputs an inverted signal indicative of an inverse of said storage datum, and an exclusive OR gate outputting said flip-flop input signal so as to indicate an exclusive OR of said inverted signal and said (2i−1)-th input signal and said 2i-th input signal.

4. A semiconductor apparatus comprising:

a set of n comparators which is responsive to 2n input signals for outputting n digital result signals, wherein an i-th comparator where i is an natural number not more than n of said n comparator is responsive to a (2i−1)-th input signal and a 2i-th input signal of said 2n input signals for outputting an i-th digital result signal of said n digital result signals in synchronization with a clock signal; and an AND gate outputting a total result signal indicative of an AND of said n digital result signals, wherein said i-th comparator inverts said i-th digital result signal at a timing indicated by said clock signal while said (2i−1)-th input signal and said 2i-th input signal coincide with each other, and does not invert said digital result signal while said (2i−1)-th input signal and said 2i-th input signal do not coincide with each other.

5. The semiconductor apparatus according to claim 4, wherein said i-th comparator includes:

a logic circuit outputting a flip-flop input signal in response to said (2i−1)-th input signal and said 2i-th input signal, and a flip-flop latching said flip-flop input signal to store a storage datum, and outputting said i-th digital result signal in response to said storage datum, and wherein said logic circuit outputs said flip-flop input signal so as to indicate an inverse of said storage datum while said (2i−1)-th input signal and said 2i-th input signal coincide with each other, and outputs said flip-flop input signal so as to indicate said storage datum while said (2i−1)-th input signal and said 2i-th input signal do not coincide with each other.

6. The semiconductor apparatus according to claim 5, wherein said logic circuit includes:

an inverter which receives said storage datum and outputs an inverted signal indicative of an inverse of said storage datum, and an exclusive OR gate outputting said flip-flop input signal so as to indicate an exclusive OR of said inverted signal and said (2i−1)-th input signal and said 2i-th input signal.

* * * * *